US008174596B2

(12) United States Patent
Wang et al.

(10) Patent No.: US 8,174,596 B2
(45) Date of Patent: May 8, 2012

(54) WAFER-SCALE LINEAR IMAGE SENSOR CHIP AND METHOD WITH REPLICATED GAPLESS PIXEL LINE AND SIGNAL READOUT CIRCUIT SEGMENTS

(75) Inventors: Weng-Lyang Wang, Saratoga, CA (US);
Shengmin Lin, Santa Clara, CA (US);
Chi-Pin Lin, Kaohsiung (TW); Feng-Ke Hsiao, Nantou (TW)

(73) Assignee: CMOS Sensor Inc., Cupertino, CA (US)

(*) Notice: Subject to any disclaimer, the term of this patent is extended or adjusted under 35 U.S.C. 154(b) by 387 days.

(21) Appl. No.: 12/506,254

(22) Filed: Jul. 21, 2009

(65) Prior Publication Data
US 2011/0019046 A1 Jan. 27, 2011

(51) Int. Cl.
*H04N 3/14* (2006.01)
(52) U.S. Cl. ........................................................ 348/294
(58) Field of Classification Search .................. 348/294, 348/301, 332, 282, 323–324
See application file for complete search history.

(56) References Cited

U.S. PATENT DOCUMENTS

| | | | | |
|---|---|---|---|---|
| 5,767,901 A | * | 6/1998 | Kimura | 348/272 |
| 5,784,101 A | * | 7/1998 | Hasegawa | 348/282 |
| 7,358,997 B2 | * | 4/2008 | Angal et al. | 348/323 |

* cited by examiner

*Primary Examiner* — David Ometz
*Assistant Examiner* — Ahmed A Berhan
(74) *Attorney, Agent, or Firm* — Chein-Hwa Tsao; CH Emily LLC

(57) ABSTRACT

A wafer-scale linear image sensor chip (WLISC) is proposed with gapless pixel line and signal readout circuit segments. The WLISC converts pixel line image (PLI) of length $L_{PL}$ into line image signal (LIS). The WLISC includes a linear array of sensor segments. Each sensor segment includes a gapless local pixel line segment ($LPLS_j$) of sensing elements. The $LPLS_j$ converts portion of the PLI into a raw image segment signal set ($RISS_j$). The $LPLS_j$ set forms a gapless global pixel line (GPL) corresponding to PLI. The sensor segment also includes readout circuit segment ($RCS_j$) coupled to $LPLS_j$ for processing $RISS_j$ into a readout image segment signal set ($ROSS_j$). The $RCS_j$ has a set of contact pads ($CTP_j$) for off-chip interconnection. Upon off-chip interconnection of the $CTP_j$ set thus composing the $ROSS_j$ set into LIS, the WLISC functions as a key part of a linear image sensor system of image length $L_{PL}$.

12 Claims, 7 Drawing Sheets

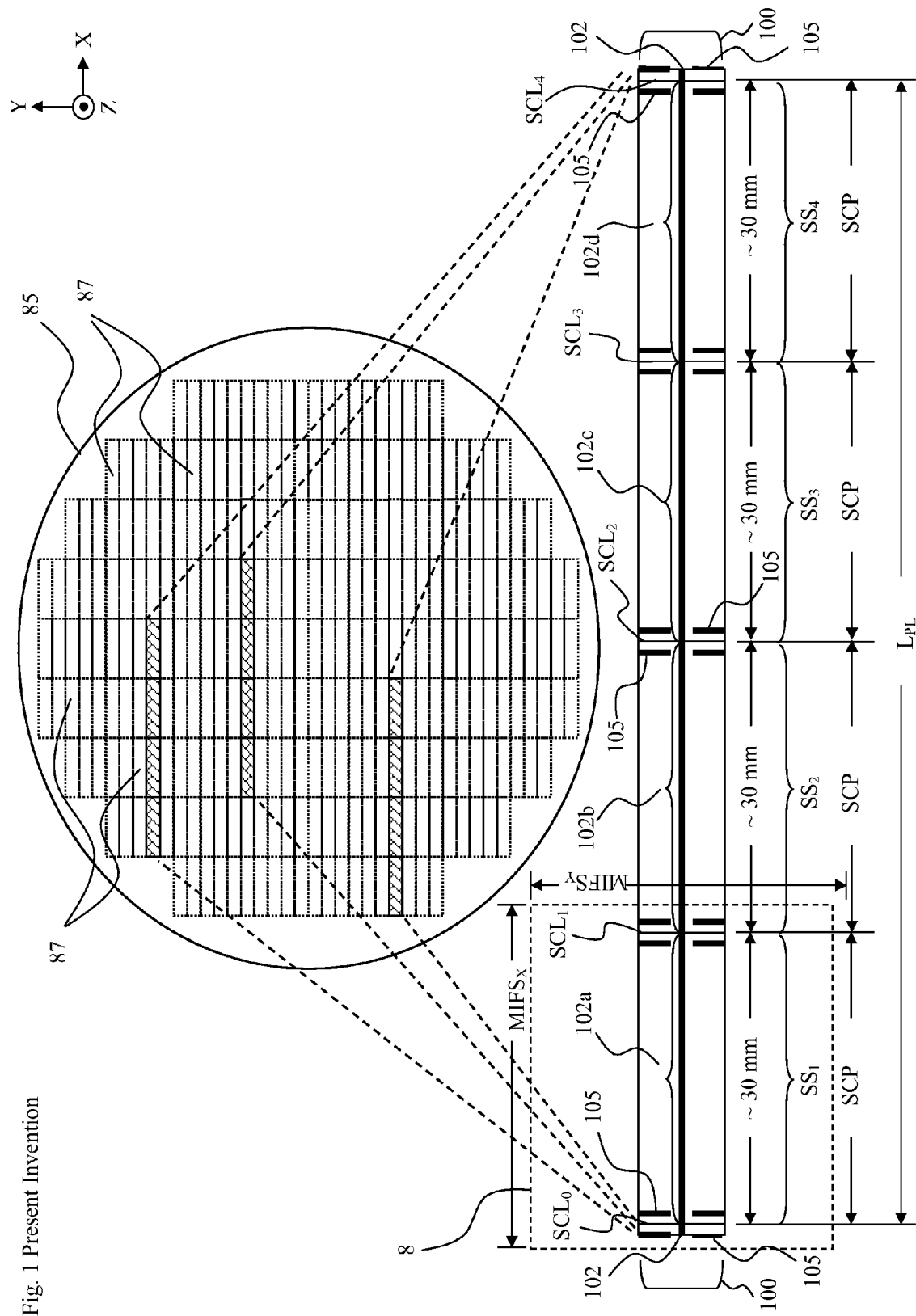
Fig. 1 Present Invention

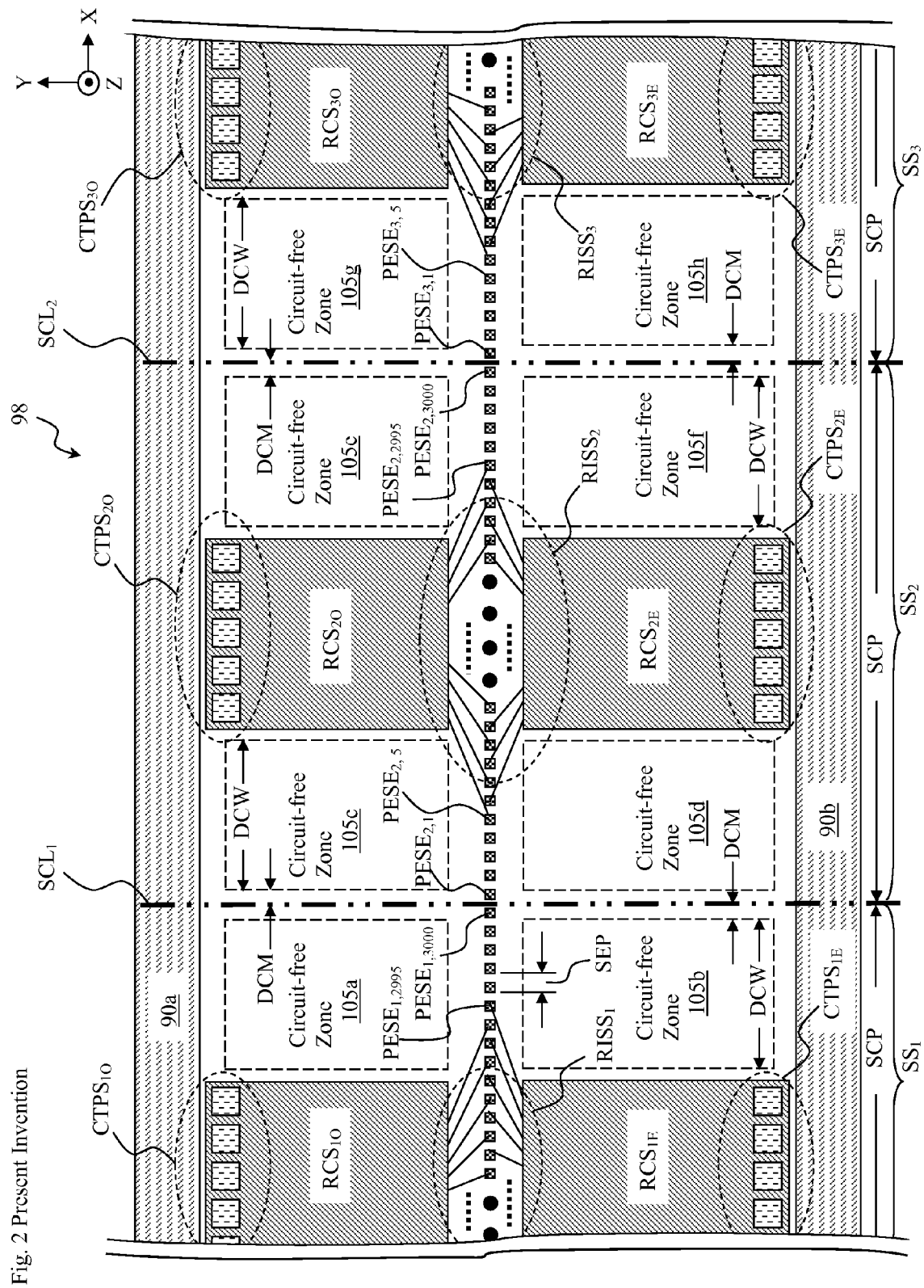
Fig. 2 Present Invention

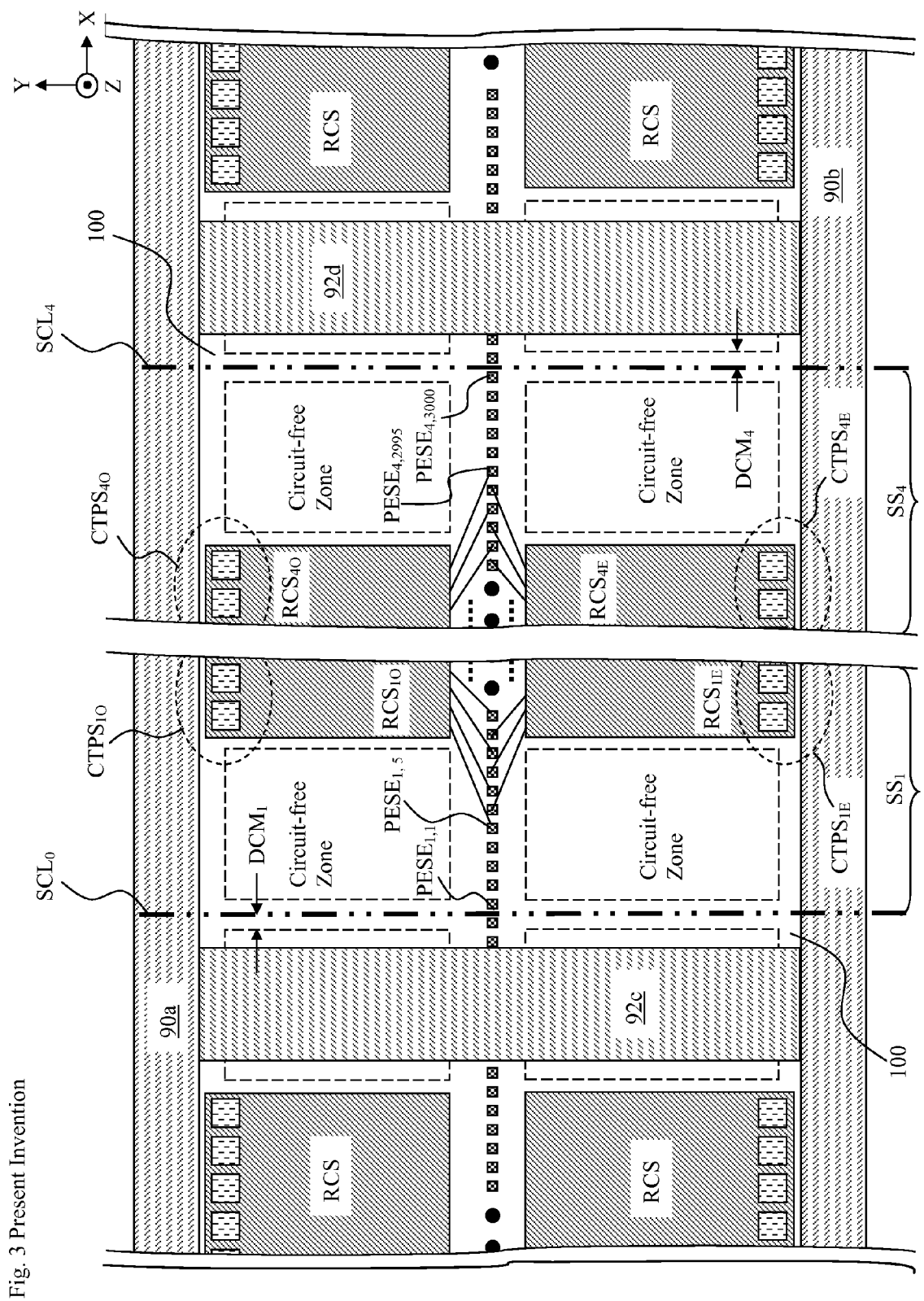
Fig. 3 Present Invention

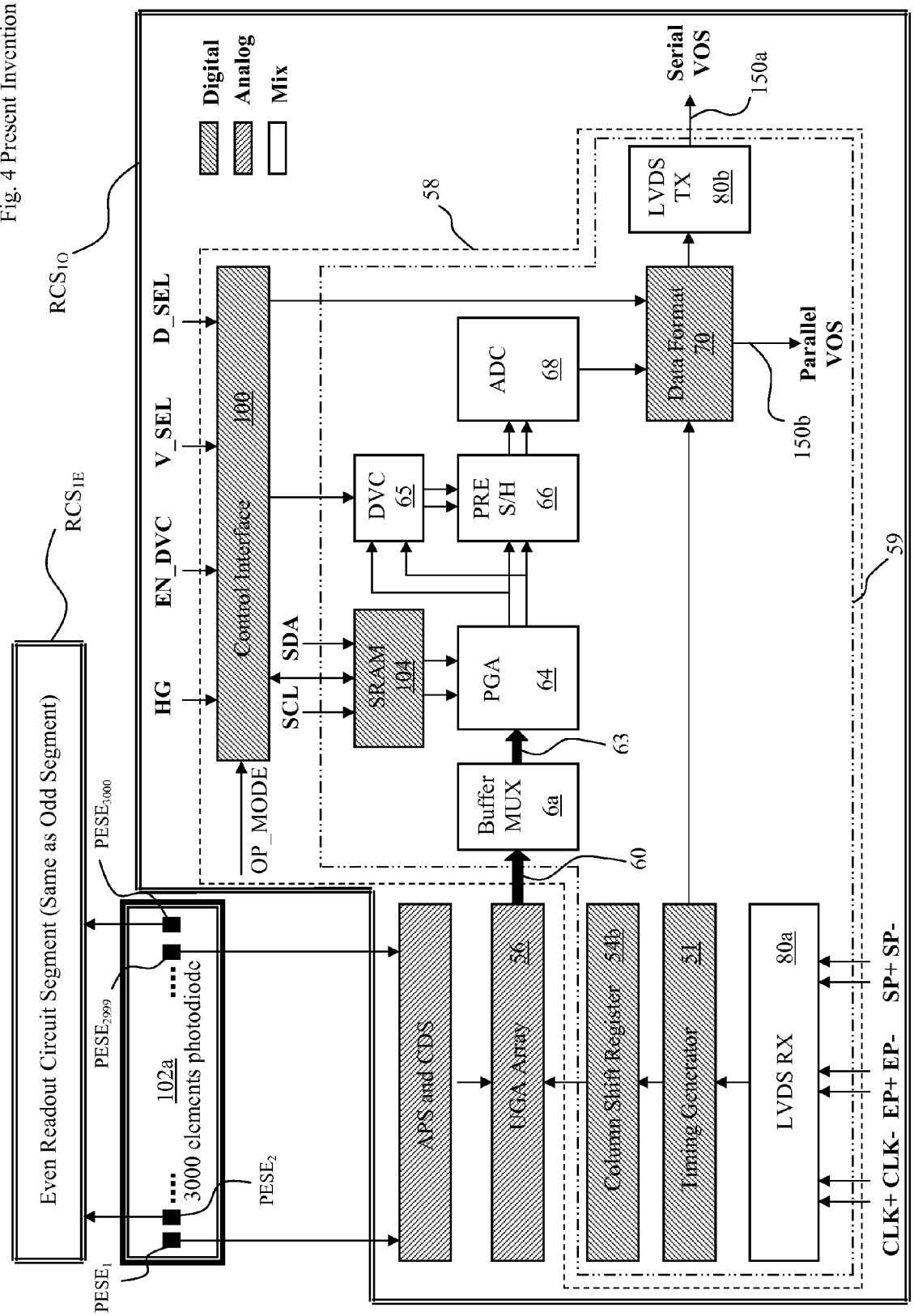
Fig. 4 Present Invention

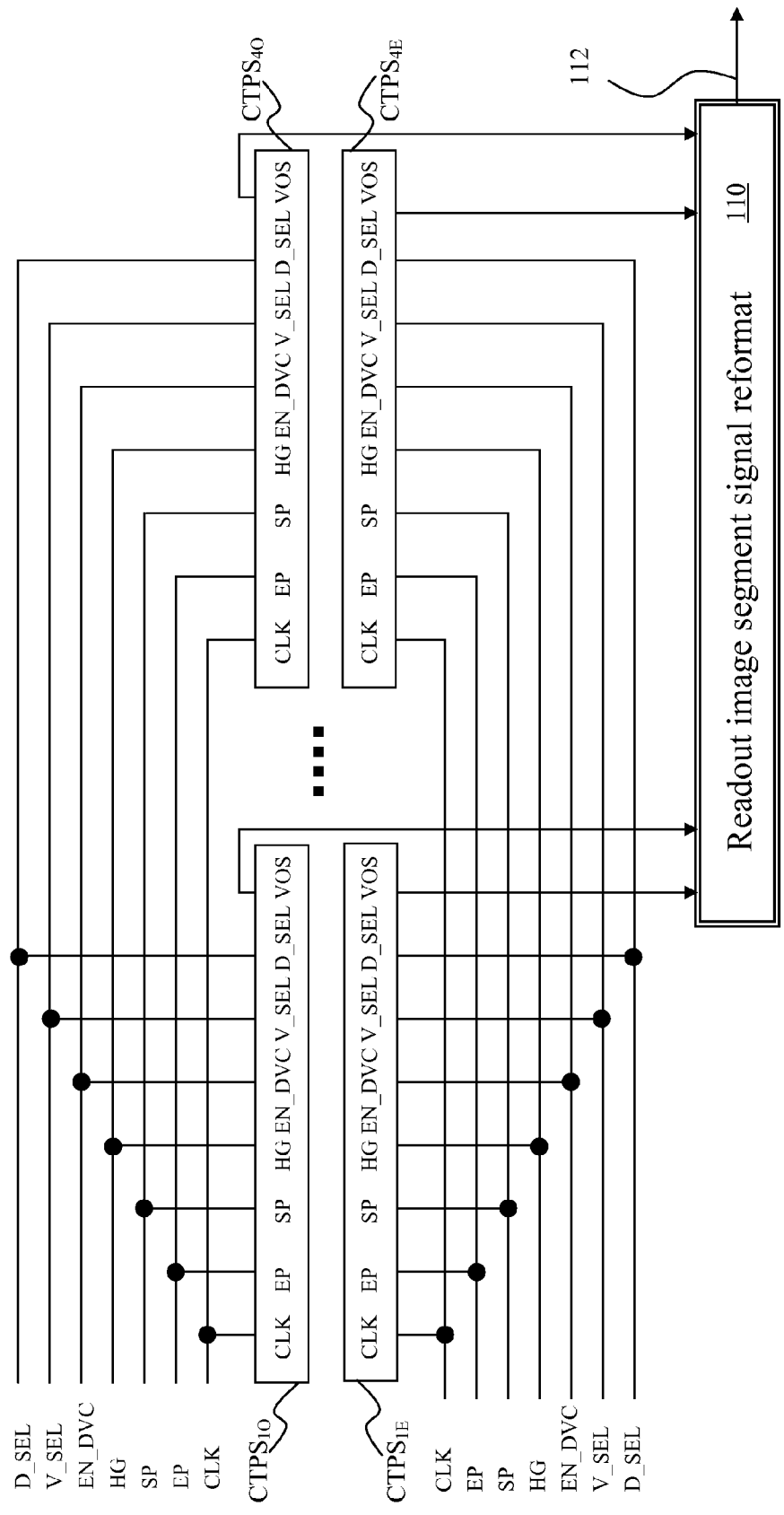
Fig. 5 Present Invention

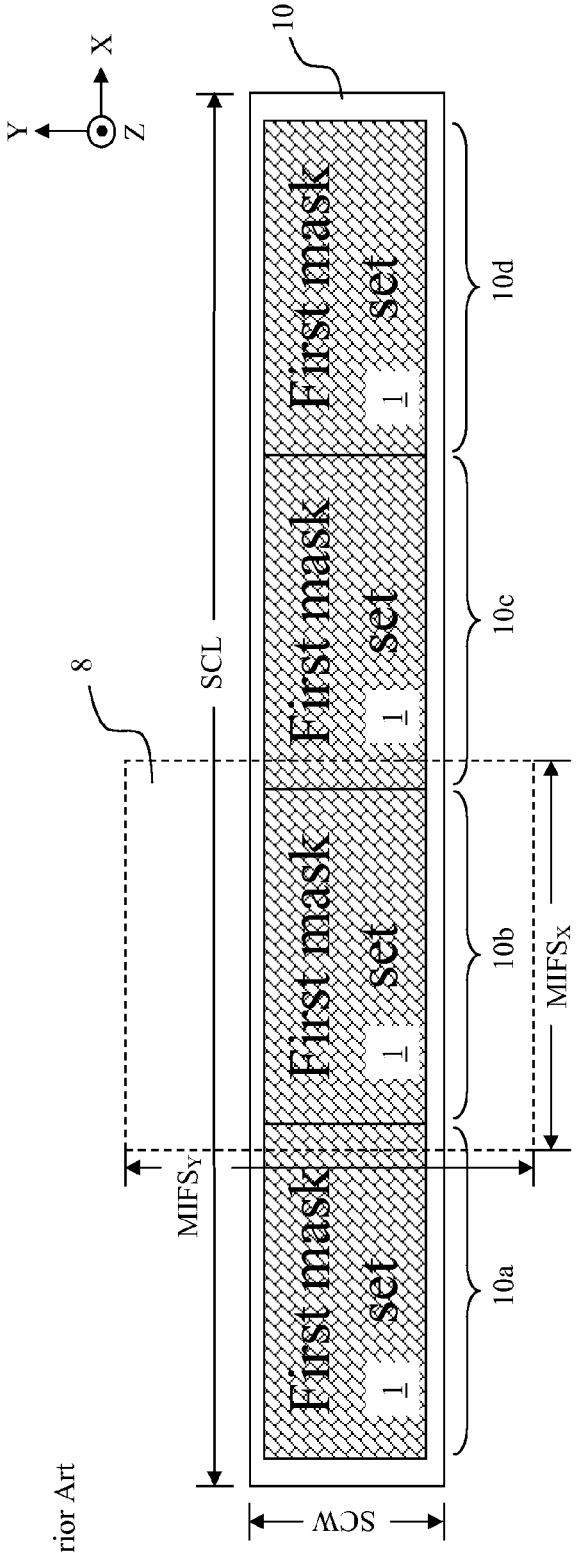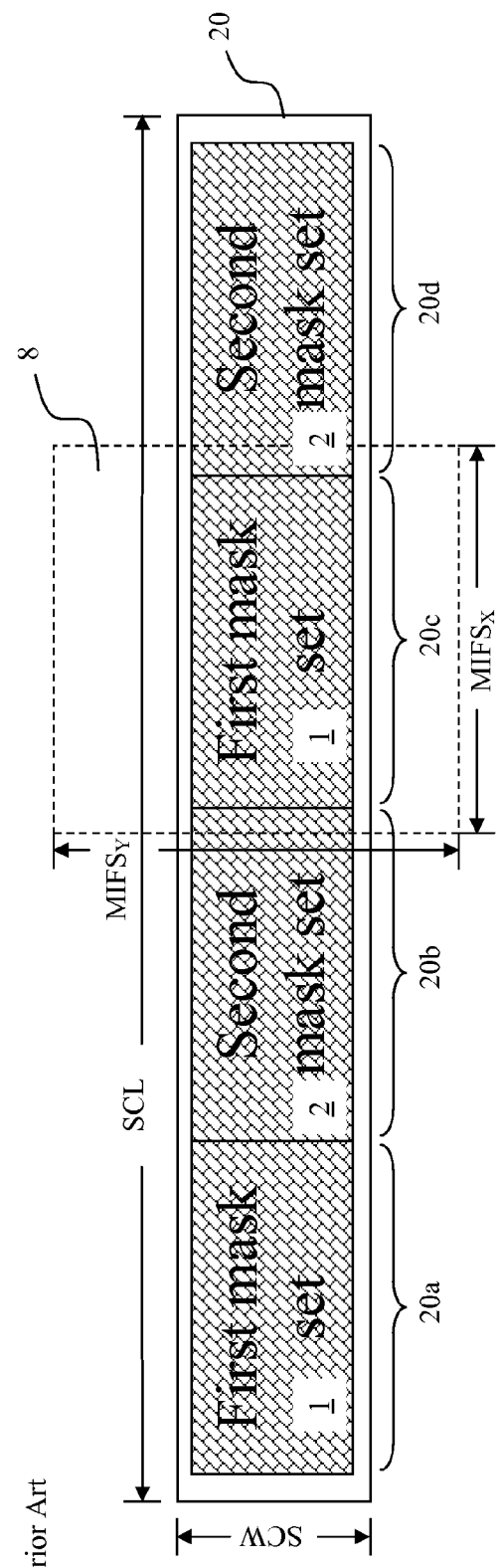

WAFER-SCALE LINEAR IMAGE SENSOR CHIP AND METHOD WITH REPLICATED GAPLESS PIXEL LINE AND SIGNAL READOUT CIRCUIT SEGMENTS

CROSS REFERENCE TO RELATED APPLICATION

This invention is related to the following previously filed U.S. patent applications:

Title: "A Multi-resolution Image Sensor Array with High Image Quality Pixel Readout Circuitry" by Shengmin Lin, Weng-Lyang Wang, with U.S. patent application Ser. No. 11/869,732 and publication#US-2009-0091648, hereinafter referred to as U.S. Ser. No. 11/869,732

Title: "Areal Active Pixel Image Sensor with Programmable Row-specific Gain for Hyper-Spectral Imaging", Inventors: Weng-Lyang Wang, Shengmin Lin. U.S. application Ser. No. 12/171,351, hereinafter referred to as U.S. Ser. No. 12/171,351 whose contents are incorporated herein by reference for any and all purposes.

BACKGROUND OF THE INVENTION

1. Field of the Invention

The present invention relates to electronic imaging. More particularly, the present invention is related to the structural design of a wafer-scale linear image sensor chip and method of making.

2. Related Background Art

An important trend of electronic imaging with a linear image sensor chip is the increase of total imaging length while preserving high pixel-pixel registration accuracy within the chip, ideally absent of any anomalous inter-pixel gaps. Other than a fundamental limitation imposed upon the total imaging length by the semiconductor wafer size, another potential indirect limitation on the total imaging length comes from a maximum allowable imaging field size (MIFS) of a wafer processing foundry fabricating the semiconductor wafer and this is illustrated in FIG. 6 and FIG. 7. More specifically, the MIFS is the maximum allowable single imaging field size of a precision step-and-repeat photolithographic imaging equipment defining the specific integrated circuit pattern to be created out of the wafer. Here, a specific MIFS is characterized by a maximum allowable imaging field size $MIFS_X$ along the X-direction and a maximum allowable imaging field size $MIFS_Y$ along the Y-direction.

To keep the illustration free from the fundamental limitation imposed by the wafer size, two linear image sensor chips (LISC) 10 and LISC 20, both sized the same with a sensor chip length SCL and sensor chip width SCW smaller than the wafer size, are respectively shown in FIG. 6 and FIG. 7. A maximum allowable imaging field 8, of size $MIFS_X$ and $MIFS_Y$, are superimposed upon the sensor chip images. While SCW is smaller than $MIFS_Y$, SCL exceeds $MIFS_X$ and the circuit design of both LISC 10 and LISC 20 need to be partitioned into a number of sensor segments each sized within the maximum allowable imaging field 8 to allow photolithographic imaging through mask set(s) in a step-and-repeat manner. Thus, LISC 10 is partitioned into sensor segment $SS_1$ 10a, sensor segment $SS_2$ 10b, sensor segment $SS_3$ 10c and sensor segment $SS_4$ 10d. Similarly, LISC 20 is partitioned into sensor segment $SS_1$ 20a, sensor segment $SS_2$ 20b, sensor segment $SS_3$ 20c and sensor segment $SS_4$ 20d.

Turning now to the key difference between LISC 10 and LISC 20. The circuit design of LISC 10 is such that the four sensor segments $SS_1$ 10a-$SS_4$ 10d are identical whereas that of LISC 10 is such that the four sensor segments $SS_1$ 20a-$SS_4$ 20d are different although $SS_1$ 20a equals $SS_3$ 20c and $SS_2$ 20b equals $SS_4$ 20d. As a result, LISC 10 can be photolithographically imaged with a single first mask set 1 whereas LISC 20 must be photolithographically imaged with a far more complicated procedure, called wafer stitching technology, using two interleaved mask sets 1 and 2 with corresponding switching of mask sets inserted in an otherwise much simpler step-and-repeat process. Consequently, while the wafer stitching technology can achieve long sensor chip size exceeding the MIFS with total flexibility of circuit design, its usage of multiple mask sets substantially lowers the photolithographic imaging throughput thus causes the sensor chip to be very high cost. Furthermore, the fact that each modern day mask set itself actually includes in the neighborhood of 10~20 photo masks vastly exacerbates this throughput problem. As an example feedback from a wafer foundry, the production throughput per wafer under wafer stitching technology using two (2) mask sets is about six (6) times slower than an otherwise single mask set process.

FIG. 8 illustrates another prior art technology called chip-chip butting with a superimposed maximum allowable imaging field 8 of size $MIFS_X$ and $MIFS_Y$. Instead of "stitching" sensor elements at the wafer level, individual image sensors chip-1 34a through chip-7 34g, each previously diced off from a wafer with size smaller than the maximum allowable imaging field 8, are pairwise butted against each other and affixed onto a butting substrate 32 to form a final butted linear image sensor 30. While chip-chip butting totally avoids the problem of low wafer imaging throughput associated with the aforementioned wafer stitching technology, the totally mechanical nature of chip-chip butting usually leaves an undesirable butting gap between neighboring chips. This is illustrated with a butting gap BTGP of 10~20 micron between image sensor chip-3 34c and image sensor chip-4 34d. Clearly these butting gaps cause a loss of pixel-pixel registration accuracy within the butted linear image sensor 30. Accordingly, it is a primary object of the present invention to provide a long linear image sensor chip exceeding the MIFS with absence of any anomalous inter-pixel gaps while avoiding the problem of low wafer imaging throughput associated with wafer stitching technology.

SUMMARY OF THE INVENTION

A wafer-scale linear image sensor chip (WLISC) is proposed that has a gapless pixel line and multiple signal readout circuit segments. Expressed in an X-Y-Z Cartesian coordinate system with its pixel line along the X-direction and principal chip surface lying in the X-Y plane, the WLISC photoelectrically converts a pixel line image (PLI) of image length $L_{PL}$ along the X-direction into a corresponding line image signal (LIS). The WLISC includes an X-direction linear array of contiguous sensor segments $SS_1, SS_2, \ldots, SS_j, \ldots, SS_M$ (M>1) spaced at a scribe pitch (SCP). Each $SS_j$ further includes:

a) A gapless local pixel line segment ($LPLS_j$) of photoelectrical sensing elements $PESE_{j1}, PESE_{j2}, \ldots, PESE_{jk}, \ldots, PESE_{jN}$ (N>=1) spaced at a sensor element pitch (SEP). The $LPLS_j$ converts a corresponding local segment of the PLI into a raw image segment signal set ($RISS_j$). The set of $LPLS_j$ also form a gapless global pixel line (GPL) corresponding to the PLI.

b) A readout circuit segment ($RCS_j$) coupled to the $LPLS_j$ for processing the $RISS_j$ into a readout image segment signal set ($ROSS_j$). The $RCS_j$ also includes a set of contact pads ($CTP_j$) for off-chip signal interconnection.

Upon a pre-determined configuration of off-chip interconnection of the contact pad set ($CTP_1, \ldots, CTP_M$) so as to compose the ($ROSS_1, \ldots, ROSS_M$) into the LIS, the WLISC functions as a key part of a linear image sensor system of image length $L_{PL}$.

In a more detailed embodiment, the WLISC includes two dicing margins $DCM_1$ and $DCM_M$ located respectively contiguous to the first sensor segment $SS_1$ and the last sensor segment $SS_M$.

In an important embodiment, each $SS_j$ has the same structure in that each $LPLS_j$ and each $RCS_j$ are replicated across $SS_1, SS_2, \ldots, SS_M$.

To maintain a good photolithographic mask imaging throughput during its wafer manufacturing process, each $SS_j$ is sized to be within the MIFS of a step-and-repeat imaging equipment while the total size of the WLISC is allowed to exceed the MIFS.

In a more detailed embodiment, the $RCS_j$ further includes N pixel readout circuits $PRC_{jk}$ (k=1, 2, ..., N) each respectively coupled to a corresponding $PESE_{jk}$ and at least one pair of neighboring pixel readout circuits $PRC_{jk}$, $PRC_{jk+1}$ are, referencing the Y-direction, placed at the opposite side of the $LPLS_j$ so as to relieve an X-direction circuit integration density of the $RCS_j$.

In a more specific embodiment, the odd-numbered ($PRC_{j1}$, $PRC_{j3}$, $PRC_{j5}$, ...) are serially coupled together to provide a first-half sequential readout image segment signal set ($ROS1_j$). The even-numbered ($PRC_{j2}$, $PRC_{j4}$, $PRC_{j6}$, ...) are serially coupled together to provide a second-half sequential readout image segment signal set ($ROS2_j$). Consequently, the sequential interdigitation of the $ROS1_j$ and the $ROS2_j$ via off-chip interconnection would form the $ROSS_j$.

In a more specific embodiment, a first-contiguous-half of the odd-numbered ($PRC_{j1}$, $PRC_{j3}$, $PRC_{j5}$, ...) are serially coupled together to provide a first-quarter sequential readout image segment signal set ($ROS1/4_j$). A second-contiguous-half of the odd-numbered ($PRC_{j1}$, $PRC_{j3}$, $PRC_{j5}$, ...) are serially coupled together to provide a second-quarter sequential readout image segment signal set ($ROS2/4_j$). A first-contiguous-half of the even-numbered ($PRC_{j2}$, $PRC_{j4}$, $PRC_{j6}$, ...) are serially coupled together to provide a third-quarter sequential readout image segment signal set ($ROS3/4_j$). A second-contiguous-half of the even-numbered ($PRC_{j2}$, $PRC_{j4}$, $PRC_{j6}$, ...) are serially coupled together to provide a fourth-quarter sequential readout image segment signal set ($ROS4/4_j$). Consequently, the sequential interdigitation of the set ($ROS1/4_j$, $ROS2/4_j$, $ROS3/4_j$, $ROS4/4_j$) via off-chip interconnection would form the $ROSS_j$.

In a more specific embodiment, each $PESE_{jk}$ is a photodiode and each $PRC_{jk}$ further includes a transfer control switch and a feedback-loop operational amplifier both coupled to the photodiode plus an in-pixel correlated double sampling (CDS) circuit.

These aspects of the present invention and their numerous embodiments are further made apparent, in the remainder of the present description, to those of ordinary skill in the art.

BRIEF DESCRIPTION OF THE DRAWINGS

In order to more fully describe numerous embodiments of the present invention, reference is made to the accompanying drawings. However, these drawings are not to be considered limitations in the scope of the invention, but are merely illustrative:

FIG. 6 and FIG. 7 together illustrate a prior art wafer stitching technology as applied to linear image sensor chips;

FIG. 1 illustrates the global top view of a present invention wafer-scale linear image sensor chip together with its related wafer map prior to chip dicing;

FIG. 2 illustrates a more detailed architectural top view of a partial wafer-scale linear image sensor chip of the present invention prior to chip dicing;

FIG. 3 illustrates the more detailed architectural top view of the present invention wafer-scale linear image sensor chip after chip dicing;

FIG. 4 illustrates a gapless local pixel line segment, its coupled readout circuit segments and an architectural example of a readout circuit segment; and FIG. 5 illustrates an example of an off-chip interconnection configuration for a wafer-scale linear image sensor chip corresponding to the architectural example of a readout circuit segment in FIG. 4.

DETAILED DESCRIPTION OF THE PREFERRED EMBODIMENTS

Figure 8:
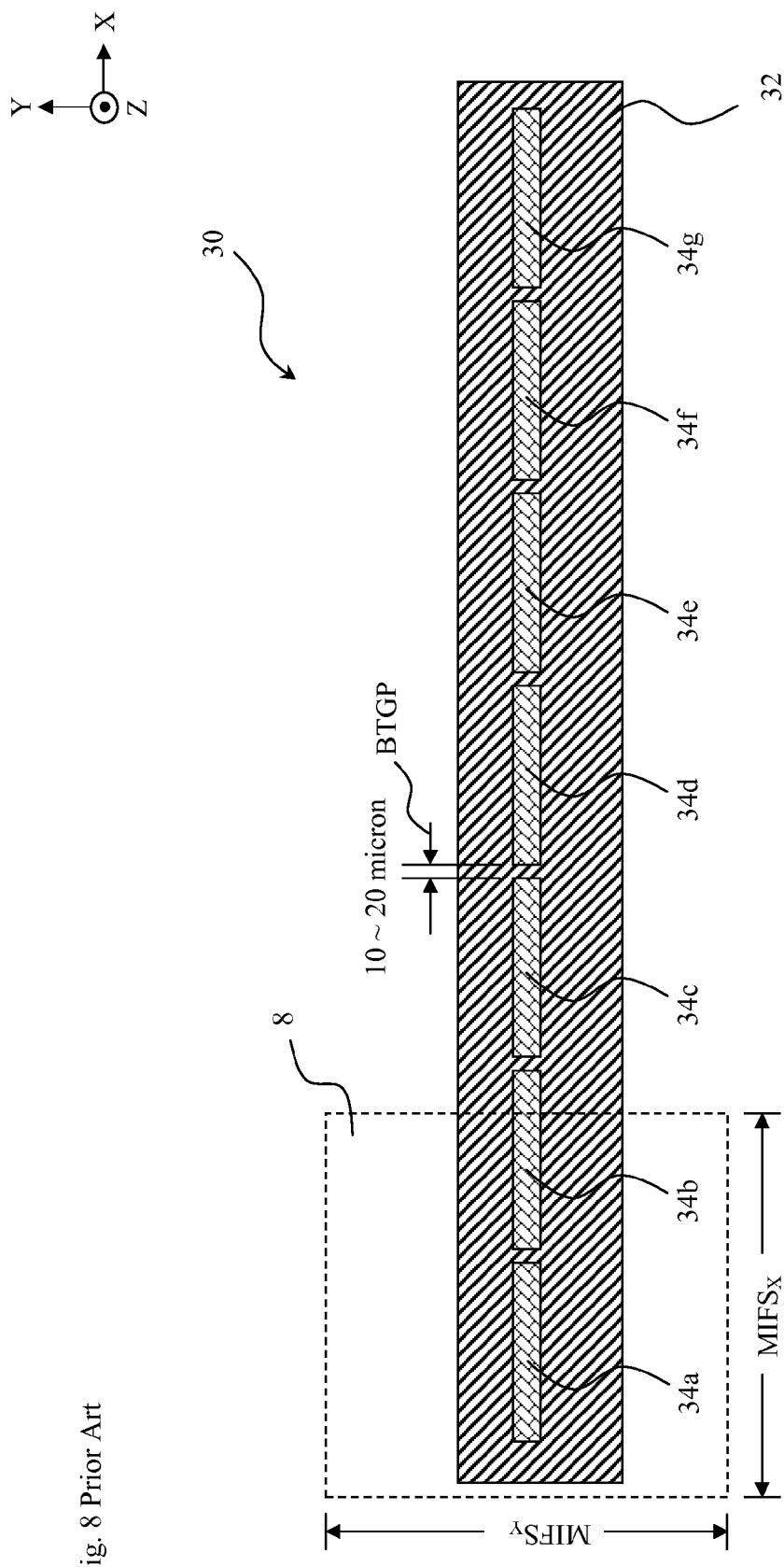
FIG. 8 illustrates a prior art chip-chip butting technology as applied to a butted linear image sensor.

The description above and below plus the drawings contained herein merely focus on one or more currently preferred embodiments of the present invention and also describe some exemplary optional features and/or alternative embodiments. The description and drawings are presented for the purpose of illustration and, as such, are not limitations of the present invention. Thus, those of ordinary skill in the art would readily recognize variations, modifications, and alternatives. Such variations, modifications and alternatives should be understood to be also within the scope of the present invention.

FIG. 1 illustrates an enlarged global top view of a present invention WLISC 100 together with its related wafer map on a processed semiconductor wafer 85 prior to chip dicing. In this example, the WLISC 100 has a gapless global pixel line (GPL) 102 of image length $L_{PL}$ along the X-direction and with its principal chip surface lying in the X-Y plane. The WLISC 100 is formed with an X-direction linear array of four (4) contiguous sensor segments $SS_1$, $SS_2$, $SS_3$, $SS_4$ spaced at an example scribe pitch SCP~30 mm and each sized to be smaller than the maximum allowable imaging field 8. Correspondingly, the GPL 102 is formed with a linear array of four (4) contiguous gapless local pixel line segments ($LPLS_1$) 102a, gapless $LPLS_2$ 102b, gapless $LPLS_3$ 102c and gapless $LPLS_4$ 102d. The contiguous sensor segments $SS_1$, $SS_2$, $SS_3$, $SS_4$ are delineated with a number of scribe lines $SCL_0$, $SCL_1$, $SCL_2$, $SCL_3$, $SCL_4$. Functionally, the WLISC 100 photoelectrically converts a pixel line image (PLI) of image length $L_{PL}$ into a corresponding line image signal (LIS).

To avoid the aforementioned problem of low wafer imaging throughput associated with the prior art wafer stitching technology, each of $SS_j$ through $SS_4$ of the present invention WLISC 100 is designed with the same internal structure. Correspondingly, the processed semiconductor wafer 85 is made with a two-dimensional array of contiguous, identical sensor segments SS 87.

As with many other wafer processes, the processed semiconductor wafer 85 for the WLISC 100 exhibits "a process yield" in that sensor segments SS 87 at certain locations on the wafer map are fully functional while sensor segments SS 87 at other locations on the wafer map would test out to be defective. Consequently, as illustrated with dashed lines connecting the wafer map and the WLISC 100, a functional WLISC 100 can only come from those unpredictable locations on the wafer map where four (4) contiguous and functional sensor segments SS 87 can be found through wafer testing. In turn, this means that any of the sensor segments SS 87 on the wafer map, hence any of ($SS_1$, $SS_2$, $SS_3$, $SS_4$), could be separated from the processed semiconductor wafer 85 with a Y-direction chip dicing street located at either side of either one of its scribe lines. Keeping in mind that each of $SS_j$ through $SS_4$ has the same internal structure. As an integrated circuit should not cross the chip dicing street to avoid damage thus loss of functionality, this means that numerous circuit-free zones 105, as illustrated, should be placed at both sides of each scribe line and close to the GPL 102.

FIG. 2 illustrates a more detailed architectural top view of a partial WLISC 98 prior to chip dicing. The partial WLISC 98 is a portion of the WLISC 100 of FIG. 1 albeit enlarged to show a right portion of sensor segment $SS_1$, sensor segment $SS_2$ and a left portion of sensor segment $SS_3$. Inter alia, chip dicing creates horizontal X-direction dicing streets 90a and 90b vertically separating the WLISC 100 from the rest of the processed semiconductor wafer 85. The sensor segment $SS_2$ has:

a) A gapless $LPLS_2$ 102b of photoelectrical sensing elements $PESE_{2,1}$, $PESE_{2,2}$, ..., $PESE_{2,3000}$ spaced at a sensor element pitch (SEP) of 10 micron in this case. As a reference information, a range of SEP from about 5 micron to about 100 micron covers most typical applications. Also, the number of PESE within a sensor segment does not have to be 3000, although a range from about 100 to about 1000000 should cover most typical applications. Together with gapless $LPLS_1$ 102a, gapless $LPLS_3$ 102c and gapless $LPLS_4$ 102d, the gapless $LPLS_2$ 102b forms the GPL 102 corresponding to the PLI. The gapless $LPLS_2$ 102b also converts a corresponding local segment of the PLI into a raw image segment signal set ($RISS_2$).

b) A readout circuit segment ($RCS_2$, having two portions $RCS_{2O}$ and $RCS_{2E}$) coupled to the gapless $LPLS_2$ 102b for processing the $RISS_2$ into a readout image segment signal set ($ROSS_2$). The $RCS_2$ also has a set of contact pads ($CTPS_{2O}$ of $RCS_{2O}$ and $CTPS_{2E}$ of $RCS_{2E}$) for off-chip signal interconnection of the $ROSS_2$.

While not shown here to avoid unnecessary obscuring details, the $RCS_{2O}$ further includes 1500 pixel readout circuits $PRC_{2j}$ (j=1, 3, 5, ..., 2999) each respectively coupled to a corresponding photoelectrical sensing element from the set ($PESE_{2,1}$, $PESE_{2,3}$, ..., $PESE_{2,2999}$). Likewise, the $RCS_{2E}$ further includes 1500 pixel readout circuits $PRC_{2k}$ (k=2, 4, 6, ..., 3000) each respectively coupled to a corresponding photoelectrical sensing element from the set ($PESE_{2,2}$, $PESE_{2,4}$, ..., $PESE_{2,3000}$). To those skilled in the art, numerous specific pixel readout circuits are available and some of them will be presently illustrated.

Notice that the two sets of pixel readout circuits $PRC_{2j}$ and $PRC_{2k}$ are, referencing the Y-direction, placed at the opposite sides of the gapless $LPLS_2$ 102b. This interdigitated arrangement of the pixel readout circuits $PRC_{2j}$ and $PRC_{2k}$ serves to relieve an X-direction circuit integration density of the $RCS_2$.

As stated before, numerous circuit-free zones should be placed at both sides of each scribe line and close to the GPL 102. Thus, specifically, circuit-free zone 105a, circuit-free zone 105b, circuit-free zone 105c and circuit-free zone 105d are placed at the sides of scribe line $SCL_1$. Likewise, circuit-free zone 105e, circuit-free zone 105f, circuit-free zone 105g and circuit-free zone 105h are placed at the sides of scribe line $SCL_2$. As a reminder, the width of each circuit-free zone is called dicing width (DCW). As an additional safety margin for chip dicing operation, dicing margins DCM can also be added contiguously to each sensor segment ($SS_1$ through $SS_4$). Other than using different indexes, the internal structures of $SS_1$, $SS_3$ and $SS_4$ are the same as that of the just illustrated sensor segment $SS_1$.

FIG. 3 illustrates the more detailed architectural top view of the WLISC 100 after complete chip dicing separating it from the rest of processed semiconductor wafer 85 with X-direction dicing streets 90a, 90b and Y-direction dicing streets 90c, 90d. It is remarked that, due to mechanical tolerance of the wafer dicing operation and consideration of related wafer material damage, the width of the Y-direction dicing streets 90c, 90d can become as large as the width of the circuit-free zone in the worst case. However, even under the worst case scenario, with the inclusion of dicing margin $DCM_1$ the left-end photoelectrical sensing elements $PESE_{1,1}$, $PESE_{1,2}$, $PESE_{1,3}$ are still buffered from functional damage. Likewise, dicing margin $DCM_4$ would buffer the right-end photoelectrical sensing elements $PESE_{4,2998}$, $PESE_{4,2999}$, $PESE4_{4,3000}$ from functional damage.

With the inclusion of the various intervening circuit-free zones between neighboring readout circuit segments (e.g., between $RCS_2$ and $RCS_3$, between $RCS_3$ and $RCS_4$, etc.) the various ($ROSS_1$, ..., $ROSS_4$) can no longer be composed, or equivalently "stitched", into the LIS via on-chip circuitry interconnecting the various ($SS_1$, $SS_2$, $SS_3$, $SS_4$). However, as conceived by the present invention, the contact pad set ($CTPS_{1O}$, $CTPS_{1E}$, ..., $CTPS_{4O}$, $CTPS_{4E}$) can instead be interconnected off-chip, via many different ways, with a predetermined configuration so as to compose the ($ROSS_1$, ..., $ROSS_4$) into the LIS. For example, to those skilled in the art, the off-chip interconnection can be accomplished with a variety of electronic packaging schemes using wire-bonding, ball-bonding, printed circuit board or even in combination with other signal composing and reformatting integrated circuits like multiplexer, etc. The WLISC 100 can then function completely, with a gapless global pixel line 102, as a key part of a linear image sensor system of image length $L_{PL}$.

As mentioned before, numerous specific pixel readout circuits are available in the art. As an example, FIG. 4 illustrates a gapless local pixel line segment $LPLS_1$ 102a, its coupled readout circuit segments $RCS_{1O}$, $RCS_{1E}$ and the internal architecture of the $RCS_{1O}$. The $LPLS_1$ 102a has 3000 PESEs ($PESE_1$, $PESE_2$, ..., $PESE_{3000}$) each made of a photodiode. The odd-numbered PESEs ($PESE_1$, $PESE_3$, ..., $PESE_{2999}$) are coupled to the $RCS_{1O}$ whereas the even-numbered PESEs ($PESE_2$, $PESE_4$, ..., $PESE_{3000}$) are coupled to the $RCS_{1E}$ in an interdigitated manner. The internal architecture of the $RCS_{1O}$ is essentially the same as presented in FIG. 1 of U.S. Ser. No. 12/171,351 except for the absence of "Row Shift Register 54a" as the present invention deals only with a linear sensor chip. For further detailed description of the $RCS_{1O}$, reference is made to U.S. Ser. No. 11/869,732 and U.S. Ser. No. 12/171,351. As for example, the $RCS_{1O}$ further includes transfer control switches and feedback-loop operational amplifiers both coupled to the photodiode elements plus numerous in-pixel correlated double sampling (CDS) circuits. As already mentioned before, the internal structure of the $RCS_{1E}$ is the same as that of $RCS_{1O}$.

FIG. 5 illustrates just one particular example, out of numerous possible variations known in the art, of an off-chip interconnection configuration for a present invention wafer-scale linear image sensor chip with the readout circuit segments of FIG. 4. In this case, the readout image segment signal sets (ROSS) from $RCS_{1O}$ through $RCS_{4E}$ are simply connected, off chip, in parallel then fed through a readout image segment signal reformatter 110 to create a final line image video signal 112.

As a variation of the detailed signal composition of a $ROSS_j$ affecting the above off-chip interconnection configuration, the odd-numbered ($PRC_{j1}$, $PRC_{j3}$, $PRC_{j5}$, . . . ) can be serially coupled together to provide a first-half sequential readout image segment signal set ($ROS1_j$). The even-numbered ($PRC_{j2}$, $PRC_{j4}$, $PRC_{j6}$, . . . ) can be serially coupled together to provide a second-half sequential readout image segment signal set ($ROS2_j$). The $ROSS_j$ can then be formed with sequential interdigitation of the $ROS1_j$ and the $ROS2_j$ via off-chip interconnection.

Another variation of the detailed signal composition of a $ROSS_j$ affecting the above off-chip interconnection configuration is as follows:

1. A first-contiguous-half of the odd-numbered ($PRC_{j1}$, $PRC_{j3}$, $PRC_{j5}$, . . . ) can be serially coupled together to provide a first-quarter sequential readout image segment signal set ($ROS1/4_j$).
2. A second-contiguous-half of the odd-numbered ($PRC_{j1}$, $PRC_{j3}$, $PRC_{j5}$, . . . ) can be serially coupled together to provide a second-quarter sequential readout image segment signal set ($ROS2/4_j$).
3. A first-contiguous-half of the even-numbered ($PRC_{j2}$, $PRC_{j4}$, $PRC_{j6}$, . . . ) can be serially coupled together to provide a third-quarter sequential readout image segment signal set ($ROS3/4_j$).
4. A second-contiguous-half of the even-numbered ($PRC_{j2}$, $PRC_{j4}$, $PRC_{j6}$, . . . ) can be serially coupled together to provide a fourth-quarter sequential readout image segment signal set ($ROS4/4_j$).

The $ROSS_j$ can then be formed with sequential interdigitation of the set ($ROS1/4_j$, $ROS2/4_j$, $ROS3/4_j$, $ROS4/4_j$) via off-chip interconnection.

A wafer-scale linear image sensor chip is proposed with a gapless pixel line and multiple signal readout circuit segments for high quality electronic imaging. Throughout the description and drawings, numerous exemplary embodiments were given with reference to specific configurations. It will be appreciated by those of ordinary skill in the art that the present invention can be embodied in numerous other specific forms and those of ordinary skill in the art would be able to practice such other embodiments without undue experimentation. The scope of the present invention, for the purpose of the present patent document, is hence not limited merely to the specific exemplary embodiments of the foregoing description, but rather is indicated by the following claims. Any and all modifications that come within the meaning and range of equivalents within the claims are intended to be considered as being embraced within the spirit and scope of the present invention.

What is claimed is:

1. A wafer-scale linear image sensor chip (WLISC) with a gapless pixel line and signal readout circuit segments for, expressed in an X-Y-Z Cartesian coordinate system with its pixel line along the X-direction and principal chip surface lying in the X-Y plane, photoelectrically converting a pixel line image (PLI) of image length $L_{PL}$ oriented along the X-direction into a corresponding line image signal (LIS), the WLISC comprises an X-direction linear array of contiguous sensor segments $SS_1$, $SS_2$, . . . , $SS_j$, . . . , $SS_M$ (M>1) spaced at a scribe pitch (SCP), wherein each $SS_j$ further comprises:

a) a gapless local pixel line segment ($LPLS_j$) of photoelectrical sensing elements $PESE_{j1}$, $PESE_{j2}$, . . . , $PESE_{jk}$, . . . , $PESE_{jN}$ (N>=1) spaced at a sensor element pitch (SEP) for:
   a1) converting a corresponding local segment of said PLI into a raw image segment signal set ($RISS_j$); and
   a2) forming a gapless global pixel line (GPL) corresponding to the PLI; and
b) a readout circuit segment ($RCS_j$) coupled to the $LPLS_j$ for processing the $RISS_j$ into a readout image segment signal set ($ROSS_j$), said $RCS_j$ further comprises a set of contact pads ($CTP_j$) for off-chip signal interconnection; the WLISC further comprises two dicing margins $DCM_1$ and $DCM_M$ located respectively contiguous to $SS_1$ and $SS_M$; thus upon a pre-determined configuration of off-chip interconnection of the contact pad set ($CTP_1$, . . . $CTP_M$) so as to compose the ($ROSS_1$, . . . , $ROSS_M$) into the LIS, the WLISC functions as a key part of a linear image sensor system of image length $L_{PL}$.

2. The WLISC of claim 1 wherein each $SS_j$ has the same structure in that each $LPLS_j$ and each $RCS_j$ are replicated across $SS_1$, $SS_2$, . . . , $SS_M$.

3. The WLISC of claim 2 wherein, to maintain a good lithographic mask imaging throughput during its wafer manufacturing process, each $SS_j$ is sized to be within a maximum allowable imaging field size of a step-and-imaging equipment while the total size of the WLISC is allowed to exceed the maximum allowable imaging field size.

4. A wafer-scale linear image sensor chip (WLISC) with a gapless pixel line and signal readout circuit segments for, expressed in an X-Y-Z Cartesian coordinate system with its pixel line along the X-direction and principal chip surface lying in the X-Y plane, photoelectrically converting a pixel line image (PLI) of image length $L_{PL}$ oriented along the X-direction into a corresponding line image signal (LIS), the WLISC comprises an X-direction linear array of contiguous sensor segments $SS_1$, $SS_2$, . . . , $SS_j$, . . . , $SS_M$ (M>1) spaced at a scribe pitch (SCP), wherein each $SS_j$ further comprises:

a) a gapless local pixel line segment ($LPLS_j$) of photoelectrical sensing elements $PESE_{j1}$, $PESE_{j2}$, . . . , $PESE_{jk}$, . . . , $PESE_{jN}$ (N>1) spaced at a sensor element pitch (SEP) for:
   a1) converting a corresponding local segment of said PLI into a raw image segment signal set ($RISS_j$); and
   a2) forming a gapless global pixel line (GPL) corresponding to the PLI; and
b) a readout circuit segment ($RCS_j$) coupled to the $LPLS_j$ for processing the $RISS_j$ into a readout image segment signal set ($ROSS_j$), said $RCS_j$ further comprises a set of contact pads ($CTP_j$) for off-chip signal interconnection; upon a pre-determined configuration of off-chip interconnection of the contact pad set ($CTP_1$, . . . , $CTP_M$) so as to compose the ($ROSS_1$, . . . , $ROSS_M$) into the LIS, the WLISC functions as a key part of a linear image sensor system of image length $L_{PL}$; and said $RCS_j$ further comprises N pixel readout circuits $PRC_{jk}$ (k=1, 2, . . . , N) each respectively coupled to a corresponding $PESE_{jk}$ and at least one pair of neighboring pixel readout circuits $PRC_{jk}$, $PRC_{jk+1}$ are, referencing the Y-direction, placed at the opposite side of the $LPLS_j$ whereby relieve an X-direction circuit integration density of the $RCS_j$.

5. The WLISC of claim 4 wherein the odd-numbered ($PRC_{j1}$, $PRC_{j3}$, $PRC_{j5}$, . . . ) are serially coupled together to provide a first-half sequential readout image segment signal set ($ROS1_j$), the even-numbered ($PRC_{j2}$, $PRC_{j4}$, $PRC_{j6}$, . . . ) are serially coupled together to provide a second-half sequential readout image segment signal set ($ROS2_j$) such that the sequential interdigitation of the ROS1$_j$ and the ROS2$_j$ via off-chip interconnection would form the ROSS$_j$.

6. The WLISC of claim 4 wherein:
   I. a first-contiguous-half of the odd-numbered (PRC$_{j1}$, PRC$_{j3}$, PRC$_{j5}$, ... ) are serially coupled together to provide a first-quarter sequential readout image segment signal set (ROS1/4$_j$);
   II. a second-contiguous-half of the odd-numbered (PRC$_{j1}$, PRC$_{j3}$, PRC$_{j5}$, ... ) are serially coupled together to provide a second-quarter sequential readout image segment signal set (ROS2/4$_j$);
   III. a first-contiguous-half of the even-numbered (PRC$_{j2}$, PRC$_{j4}$, PRC$_{j6}$, ... ) are serially coupled together to provide a third-quarter sequential readout image segment signal set (ROS3/4$_j$); and
   IV. a second-contiguous-half of the even-numbered (PRC$_{j2}$, PRC$_{j4}$, PRC$_{j6}$, ... ) are serially coupled together to provide a fourth-quarter sequential readout image segment signal set (ROS4/4$_j$)

such that the sequential interdigitation of the set (ROS1/4$_j$, ROS2/4$_j$, ROS3/4$_j$, ROS4/4$_j$) via off-chip interconnection would form the ROSS$_j$.

7. The WLISC of claim 4 wherein each PESE$_{jk}$ is a photodiode and each PRC$_{jk}$ further comprises a transfer control switch and a feedback-loop operational amplifier both coupled to the photodiode plus an in-pixel correlated double sampling (CDS) circuit.

8. A method of making a linear image sensor system having a gapless imaging pixel line of length L$_{PL}$ exceeding a maximum allowable imaging field size of a step-and-imaging equipment for semiconductor wafer manufacturing, the method comprises, as expressed in an X-Y-Z Cartesian coordinate system:
   a) providing a wafer-scale linear image sensor chip (WLISC) with principal chip surface lying in the X-Y plane and a gapless pixel line along X-direction and signal readout circuit segments for photoelectrically converting a pixel line image (PLI) of length L$_{PL}$ into a corresponding line image signal (LIS);
   b) partitioning the WLISC along X-direction into a linear array of structurally identical contiguous sensor segments SS$_1$, SS$_2$, ..., SS$_j$, ..., SS$_M$ (M>1) spaced at a scribe pitch (SCP) with each SS$_j$ sized to be within the maximum allowable imaging field size to facilitate WLISC manufacturing and with each SS$_j$ having:
      b1) a gapless local pixel line segment (LPLS$_j$) of photoelectrical sensing elements PESE$_{j1}$, PESE$_{j2}$, ..., PESE$_{jk}$, ..., PESE$_{jN}$ (N>=1) spaced at a sensor element pitch (SEP) for:
         b11) converting a corresponding local segment of the PLI into a raw image segment signal set (RISS$_j$); and
         b12) forming a gapless global pixel line (GPL) corresponding to the PLI, of photoelectrical sensing elements with the same SEP; and
      b2) a readout circuit segment (RCS$_j$) coupled to the LPLS$_j$ for processing the RISS$_j$ into a readout image segment signal set (ROSS$_j$), the RCS$_j$ having a set of contact pads (CTP$_j$) for off-chip signal interconnection; and wherein partitioning the WLISC along X-direction further comprises, during its chip manufacturing process, dicing each WLISC off from a processed wafer with two dicing margins DCM$_1$ and DCM$_M$ located respectively contiguous to the SS$_1$ and the SS$_M$;
with a pre-determined off-chip interconnection scheme, interconnecting the contact pad set (CTP$_1$, ..., CTP$_M$) so as to form the linear image sensor system with concomitant composition of the (ROSS$_1$, ..., ROSS$_M$) into the LIS.

9. A wafer-scale linear image sensor chip (WLISC) with a gapless pixel line and signal readout circuit segments for, expressed in an X-Y-Z Cartesian coordinate system with its pixel line along the X-direction and principal chip surface lying in the X-Y plane, photoelectrically converting a pixel line image (PLI) of image length L$_{PL}$ oriented along the X-direction into a corresponding line image signal (LIS), the WLISC comprises an X-direction linear array of contiguous sensor segments SS$_1$, SS$_2$, ..., SS$_j$, ..., SS$_M$ (M>1) spaced at a scribe pitch (SCP), wherein:

each SS$_j$ is sized to be within the maximum allowable imaging field size (MIFS) of a step-and-repeat imaging equipment used in the wafer manufacturing of the WLISC whereas the total size of WLISC exceeds the MIFS; and wherein each SS$_j$ comprises:
   a) a gapless local pixel line segment (LPLS$_j$) of photoelectrical sensing elements PESE$_{j1}$, PESE$_{j2}$, ..., PESE$_{jk}$, ..., PESE$_{jN}$ (N>=1) spaced at a sensor element pitch (SEP) for:
      a1) converting a corresponding local segment of said PLI into a raw image segment signal set (RISS$_j$); and
      a2) forming a gapless global pixel line (GPL) corresponding to the PLI; and
   b) a readout circuit segment (RCS$_j$) coupled to the LPLS$_j$ for processing the RISS$_j$ into a readout image segment signal set (ROSS$_j$), said RCS$_j$ further comprises a set of contact pads (CTP$_j$) for off-chip signal interconnection;

upon a pre-determined configuration of off-chip interconnection of the contact pad set (CTP$_1$, ..., CTP$_M$) so as to compose the (ROSS$_1$, ..., ROSS$_M$) into the LIS, the WLISC functions as a key part of a linear image sensor system of image length L$_{PL}$.

10. The WLISC of claim 9 wherein said SEP ranges from 5 micron to 100 micron.

11. The WLISC of claim 9 wherein the number of photoelectrical sensing elements N ranges from 100 to 1000000.

12. A method of making a linear image sensor system having a gapless imaging pixel line of length L$_{PL}$ exceeding a maximum allowable imaging field size (MIFS) of a step-and-imaging equipment for semiconductor wafer manufacturing, the method comprises, as expressed in an X-Y-Z Cartesian coordinate system:
   a) providing a wafer-scale linear image sensor chip (WLISC) with principal chip surface lying in the X-Y plane and a gapless pixel line along X-direction and signal readout circuit segments for photoelectrically converting a pixel line image (PLI) of length L$_{PL}$ into a corresponding line image signal (LIS);
   b) partitioning the WLISC along X-direction into a linear array of structurally identical contiguous sensor segments SS$_1$, SS$_2$, ..., SS$_j$, ..., SS$_M$ (M>1) spaced at a scribe pitch (SCP) with each SS$_j$ sized to be within the MIFS to facilitate processing of the step-and-imaging equipment and with each SS$_j$ having:
      b1) a gapless local pixel line segment (LPLS$_j$) of photoelectrical sensing elements PESE$_{j1}$, PESE$_{j2}$, ..., PESE$_{jk}$, ..., PESE$_{jN}$ (N>=1) spaced at a sensor element pitch (SEP) for:
         b11) converting a corresponding local segment of the PLI into a raw image segment signal set (RISS$_j$); and b12) forming a gapless global pixel line (GPL) corresponding to the PLI, of photoelectrical sensing elements with the same SEP; and b2) a readout circuit segment ($RCS_j$) coupled to the $LPLS_j$ for processing the $RISS_j$ into a readout image segment signal set ($ROSS_j$), the $RCS_j$ having a set of contact pads ($CTP_j$) for off-chip signal interconnection; and c) with a pre-determined off-chip interconnection scheme, interconnecting the contact pad set ($CTP_1, \ldots, CTP_M$) so as to form the linear image sensor system with concomitant composition of the ($ROSS_1, \ldots, ROSS_M$) into the LIS.

* * * * *